US006744111B1

(12) United States Patent
Wu

(10) Patent No.: US 6,744,111 B1
(45) Date of Patent: Jun. 1, 2004

(54) SCHOTTKY-BARRIER TUNNELING TRANSISTOR

(76) Inventor: Koucheng Wu, 3074 Vesuvius La., San Jose, CA (US) 95132

( * ) Notice: Subject to any disclaimer, the term of this patent is extended or adjusted under 35 U.S.C. 154(b) by 0 days.

(21) Appl. No.: 10/438,674

(22) Filed: May 15, 2003

(51) Int. Cl.$^7$ ............................................. H01L 27/095
(52) U.S. Cl. ...................... 257/471; 257/473; 257/474; 257/477; 257/486
(58) Field of Search ................................. 257/351, 347, 257/353, 471, 473, 474, 477, 479, 486

(56) References Cited

U.S. PATENT DOCUMENTS

| | | | |
|---|---|---|---|
| 5,040,034 | A | 8/1991 | Murakami |
| 5,049,955 | A | 9/1991 | Frecouf |
| 5,663,584 | A | 9/1997 | Welch |
| 5,962,893 | A | 10/1999 | Omura |
| 6,303,479 | B1 | 10/2001 | Snyder |
| 6,353,251 | B1 | 3/2002 | Kimura |

OTHER PUBLICATIONS

RD–292096A, Aug. 1988, RD, Annonymous.*
M. P. Lepselter and S. M. Sze, "SB–IGFET: An Insulated–Gate Field–Effect Transistor Using Schottky Barrier Contacts for Source and Drain", Proc. IEEE, pp. 1400–1402, Aug. 1968.
J. R. Tucker, C. Wang, and P. S. Carney, "Silicon Field–Effect Transistor Based on Quantum Tunneling", Appl. Phys. Lett, vol. 65, No. 5, pp. 618–620, Aug. 1994.
B. Winstead and U. Ravaioli, "Simulation of Schottky Barrier MOSFET's with a Coupled Quantum Injection/Monte Carlo Technique", IEEE Trans. Electron Devices, vol. 47, No. 6, pp. 1241–1246, Jun. 2000.
J. Kedzierski, P. Xuan, E. H. Anderson, J. Bokor, T.–J. King, and C. Hu, "Complementary Silicide Source/Drain Thin–Body MOSFETs for the 20nm Gate Length Regime", IEDM Tech. Digest, pp. 57–60, 2000.
J. D. Plummer and P. B. Griffin, "Material and Process Limits in Silicon VLSI Technology", Proc. IEEE, vol. 89, No. 3, pp. 240–258, Mar. 2001.
D. J. Frank, R. H. Dennard, E. Nowak, P. M. Solomon, Y. Taur, and H.–S. P. Wong, "Device Scaling Limits of Si MOSFETs and Their Application Dependencies", Proc. IEEE, vol. 89, No. 3, pp. 259–288, Mar., 2001.
Semiconductor Industry Association, "International Technology Roadmap for Semiconductors 2002 Update", 2002.
Y. Zhang, J. Wang, L. Wang, and B.–Y. Nguyen, "Design of 10–nm–Scale Recessed Asymmetric Schottky Barrier MOSFETs", IEEE Electron Device Letters, vol. 23, No. 7, pp. 419–421, Jul. 2002.

* cited by examiner

Primary Examiner—Minh-Loan Tran
(74) Attorney, Agent, or Firm—Xin Wen

(57) ABSTRACT

A three-terminal semiconductor transistor device comprises a semiconductor base region in contact with a first electric terminal, a conductive emitter region in contact with the semiconductor base region, forming a first Schottky barrier junction at the interface of the conductive emitter region and the semiconductor base region. The conductive emitter region is in contact with a second electric terminal. The three-terminal semiconductor transistor device further includes a conductive collector region in contact with the semiconductor base region, forming a second Schottky barrier junction at the interface of the conductive collector region and the semiconductor base region. The conductive collector region is in contact with a third electric terminal. The tunneling currents through the first and the second Schottky barrier junctions are substantially controlled by the voltage of the semiconductor base region.

31 Claims, 13 Drawing Sheets

SCHOTTKY-BARRIER TUNNELING TRANSISTOR

TECHNICAL FIELD

This application relates to a semiconductor device, specifically, a semiconductor transistor device suitable for analog and digital circuits.

BACKGROUND OF THE INVENTION

For more than 30 years, the integrated circuit industry has followed a dramatic path of shrinking device dimensions and increasing chip sizes, resulting in steadily increased performance and increased functionality. New generations of devices have appeared in every two to three years, following the so called "Moore's Law", with each new generation device approximately doubling logic circuit density, increasing performance by about 40%, and quadrupling the memory capacity comparing to the previous generation. The consistency of this advancement has led to an expectation that faster and more powerful chips will continue to be introduced on the same schedule in the foreseeable future.

The silicon semiconductor industry has charted a course for itself over the next 15 years, which attempts to continue the density and performance improvements of the past 40 years. The International Technology Roadmap for Semiconductor (ITRS) has forecasted that this device scaling and increased functionality scenario to continue until 2013, at which point the minimum feature size is projected to reach 32 nm and a single chip is expected to contain more than $10^{11}$ components.

Most of the historic trend has been achieved with the same basic switching element (the MOS transistor) and the same basic circuit topology (CMOS) based on a limited number of materials (Si, $SiO_2$, Al, $Si_3N_4$, $TiSi_2$, TiN, W, primarily). While very substantial human and financial resources invested have improved manufacturing practices over the past 40 years, the device structures of 30–40 years ago are still quite recognizable in today's IC industry.

A large part of the success of the MOS transistor is due to the fact that it can be scaled to increasingly smaller dimensions, which results in higher performance. The ability to improve performance consistently while decreasing power consumption has made CMOS architecture the dominant technology for integrated circuits. The scaling of the CMOS transistor has been the primary factor driving improvements in microprocessor performance. The transistor delay has decreased by more than 30% per technology generation resulting in a doubling of microprocessor performance every two years. In order to maintain this rapid rate of improvement, aggressive engineering of the MOS transistor is required.

Conventional scaling of gate oxide thickness, source/drain extension (SDE) junction depths, and the gate lengths has enabled MOS gate dimensions to be reduced from 10 $\mu$m in the 1970's to a present day size of 0.1 $\mu$m. To enable transistor scaling into the 21st century, new solutions such as high dielectric constant materials for gate insulation and shallow junctions with low resistivity need to be developed.

Silicon technology has reached the point at which significant innovations will be required to circumvent the challenges associated with continued MOSFET scaling. Current performance scaling trends will not continue past the 0.1 $\mu$m device technologies by using traditional scaling methods. Fundamental limits in $SiO_2$ scaling due to tunneling current, in SDE junction depths due to large increases in external resistance, and in well engineering due to leakage constraints are currently being reached. The most apparent challenges are gate insulators with high dielectric constant and ultra-shallow junctions with low sheet resistance. At present, there are no known solutions for the MOS device technologies to continue the performance trends seen in the last 20 years. Practical and fundamental limits are being approached and substantial changes to device technologies and structures are required.

Aggressive scaling of silicon integrated devices in the deep sub-micron range presents considerable challenges to device engineers. Device performance must be preserved as much as possible, when going from one generation to the next, while the devices must be manufacturable and cost-effective. As the milestone of 32-nm gate length MOSFET is approached, alternative device structures are being considered that might allow the continuation of scaling trends when physical limits of conventional MOSFETs are eventually reached. There is therefore a need to provide a device structure to enable the continued downward scaling of transistor dimensions into the 21st century.

SUMMARY OF INVENTION

Implementations of the system may include one or more of the following. The invention system generally includes a three-terminal semiconductor transistor device, comprising:
  a) a base region formed by a semiconductor material, the base region being in contact with a first electric terminal;
  b) a conductive emitter region in contact with the semiconductor base region, forming a first Schottky barrier junction at the interface of the conductive emitter region and the semiconductor base region, the conductive emitter region being in contact with a second electric terminal; and
  c) a conductive collector region in contact with the semiconductor base region, forming a second Schottky barrier junction at the interface of the conductive collector region and the semiconductor base region, the conductive collector region being in contact with a third electric terminal,
wherein the tunneling current through the first Schottky barrier junction or the second Schottky barrier junction is substantially controlled by the voltage of the semiconductor base region.

In another aspect, the invention system includes a three-dimensional three-terminal semiconductor device, comprising:
  a) a first insulating substrate layer; and
  b) a second substrate layer formed above the first insulating substrate layer, comprising
    i) a base region formed by a semiconductor material, the base region being in contact with a first electric terminal;
    ii) a conductive emitter region in contact with the semiconductor base region, forming a first Schottky barrier junction at the interface of the conductive emitter region and the semiconductor base region, the conductive emitter region being in contact with a second electric terminal; and
    iii) a conductive collector region in contact with the semiconductor base region, forming a second Schottky barrier junction at the interface of the conductive collector region and the semiconductor base region, the conductive collector region being in contact with a third electric terminal, wherein the tunneling current through the first Schottky barrier junction or the second Schottky barrier junction is substantially controlled by the voltage of the semiconductor base region.

In still another aspect, the invention system includes a three-dimensional three-terminal semiconductor device, comprising:

a) a first electric terminal formed in a lower substrate layer;

b) a middle substrate layer, comprising i) a lower conductive region in contact with the first electric terminal in the lower substrate layer, ii) a middle semiconductor region in contact with the lower conductive region in the lower substrate layer forming a first Schottky barrier junction at the interface of the middle semiconductor region and the lower conductive region, such middle semiconductor region being in contact with a second electric terminal; and iii) an upper conductive region in contact with the middle semiconductor region forming a second Schottky barrier junction at the interface of the upper conductive region and the middle semiconductor region, such upper conductive region being separated from the lower conductive region by the middle semiconductor region; and c) a third electric terminal formed over the middle substrate layer, the third electric terminal being in contact with the upper conductive region in the middle substrate layer, wherein the tunneling current through the first Schottky barrier junction or the second Schottky barrier junction is substantially controlled by the voltage of the middle semiconductor region.

The new device structure described in the present invention is called Schottky Barrier Tunneling Transistor (SBTT). The basic device structure is a metal-semiconductor-metal (MSM) sandwich structure. This structure has two Schottky diodes connected back-to-back. The SBTT transistor has three terminals—emitter, base, and collector. The emitter and the collector regions are made of metals or silicides. The base region is made of a semiconductor such as silicon. The device has two complimentary device types—n-channel and p-channel transistors. The base is n-type doped for an n-channel SBTT and p-type doped for a p-channel SBTT. The emitter-to-base junction and the collector-to-base junction are Schottky barrier junctions. The device is normally off because carriers are blocked by the two Schottky barriers.

The current conduction mechanism in SBTT is primarily attributed to the tunneling current through the emitter-base and collector-base Schottky barriers. The Schottky barrier widths and heights are modulated by the base voltage. When the base of an n-channel SBTT is positively biased, the Schottky barrier widths and heights are reduced, and electrons can tunnel through the Schottky barriers. If the collector is also positively biased, the injected electrons can transport through the thin base region without recombinations because electrons are the majority carriers in the n-type doped base. For a p-channel SBTT, the base is negatively biased to turn on the device.

The SBTT is a symmetric device when the emitter and the collector are made of the same material. The emitter and the collector are then interchangeable in the circuit design. The emitter and the collector can even be made of the same material for both n- and p-channel SBTTs. The device parameters, such as the base width, the base doping density, and the potential barrier heights for electrons and holes, can be properly chosen to produce symmetric I–V characteristics for n- and p-channel devices. For example, if the emitter/collector metal (or silicide) work function is slightly below the mid band gap of the base semiconductor, the potential barrier height for holes is smaller than the potential barrier height for electrons. The asymmetric potential barriers can compensate the higher tunneling efficiency of electrons than that of holes because electrons have a higher effective Richardson constant and a smaller effective mass than those of holes. In the digital circuit design using SBTTs, on the same current path, the transistor sizes of n- and p-channel devices can be the same to create a compact layout design. On the other hand, in the CMOS digital circuit design, the p-channel MOSFET usually needs to be three times bigger than the n-channel MOSFET to achieve the same driving current because the electron mobility is about three times of the hole mobility. The unequal transistor sizes between n- and p-channel MOSFETs will increase the chip size and reduce the utilization efficiency on the silicon area.

The SBTT provides complete solutions for the issues with the MOS device scaling. The SBTT has better scalability than the MOSFET because of its compact geometries and structural simplicity. There are currently no known solutions for the three major challenges for the MOS device scaling, namely, the gate insulators with high dielectric constant, the source/drain shallow junctions with low sheet resistance, and the low power supply voltage. In contrast, the SBTT does not have the gate insulator issue because it is not a field effect transistor and thus does not need a gate insulator.

The emitter and the collector of a SBTT are made of low-resistance metals or silicides, which significantly reduce the emitter/collector series resistances and increase the device driving current. The SBTT is promised to be a high-speed device because of its thin base and low emitter/collector series resistances. For a MOS device, the source and drain are heavily doped semiconductors. The source/drain series resistances and the contact resistances are increased with device scaling because the contact sizes and the source/drain junction depths become smaller. The increasing parasitic resistances substantially degrade the driving current of nano-scale MOSFETs. Although the MOS device speed is improved by scaling the gate length, the delay from the parasitic resistances plays an increasingly important role. For a SBTT, the contacts between interconnect lines and the emitter/collector regions are metal-to-metal or metal-to-silicide contacts. The contact resistances are negligible compared to the contact resistances of the source/drain metal-to-semiconductor contacts.

Another advantage of the present invention is that the invention SBTT device can be operated at a low power supply voltage due to its unique current conduction mechanism. The SBTT device can operate, for example, 0.4 V or below, because the current conduction mechanism is quantum mechanical tunneling. The electrons inject from the conduction band of the emitter to the conduction band of the base through the emitter-base Schottky barrier by tunneling. The power supply voltage does not need to be large enough to induce the carrier inversion. The device can be designed so that the Schottky barrier can be modulated by a small base voltage. The device simulation shows that the turn-on behavior of a SBTT is more sensitive than that of a MOSFET. On the other hand, the current conduction mechanisms are drift and diffusion in a MOSFET. For an n-channel MOSFET, the silicon surface needs to be inverted from p-type to n-type by a positive gate voltage and forms a channel to connect the source and the drain. The required gate voltage depends on the gate insulator thickness, gate insulator dielectric constant, surface doping, and the silicon band gap. The surface doping actually increases with shrinking device dimensions in order to suppress the short channel effect. The reduction of power supply voltage in the past is primarily attributed to the gate oxide thickness reduction. To have a reasonable on/off current ratio, the power supply voltage is difficult to be smaller than 0.6 V. In the last 10 years, the MOS device scaling basically follows the constant electric field scaling rules to maintain constant electric fields inside the device. For example, the average electric field between drain and source remains the same when the technology migrates from 0.5 $\mu$m (with $V_{dd}$=5 V) in 1993 to 0.1 $\mu$m (with $V_{dd}$=1 V) in 2003. In the next 10 years, according to the ITRS Roadmap, the scaling of power supply voltage is slower than the scaling of MOS device geometries. For example, the power supply voltage is only reduced to 0.6 V for the 32-nm technology in 2013, which should be 0.32 V if the constant electric field scaling rules are strictly followed. The maximum electric fields in the gate insulator and in the channel will be increased for the future small geometry devices. The higher electric fields will cause the problems of higher gate leakage current, short channel effect, hot-carrier injection, gate insulator reliability, and higher power consumption. The difficulty of scaling down the power supply voltage should eventually slow down the MOS device scaling roadmap.

Yet another advantage of the present invention is that the SBTT chip will consumes less power than a comparable CMOS chip. Since the power supply voltage can be reduced with the shrinking device dimensions, the SBTT can follow the constant electric field scaling rules. The power density per unit area can he maintained as a constant for different technology generations. In contrast, the power density of a CMOS chip will be increased because the power supply voltage is higher than the value suggested by the constant electric field scaling rules. Moreover, the SBTT's emitter/collector series resistances are significantly smaller than MOSFET's source/drain series resistances. The SBTT's emitter/collector metal-to-metal contact resistance is also significantly smaller than MOSFET's metal-to-semiconductor contact resistance. The power consumption due to the parasitic components of SBTTs is much smaller than that of MOSFETs.

Still another advantage of the invention is that SBTT overcomes many of the difficulties in the fabrication of the nano-scale MOS devices. The SBTT structure requires no source/drain junctions. This property alleviates the requirement of very steep p-n and n-p junctions and extremely high doping in source/drain regions, which are significant challenges in the fabrication of small-geometry MOSFETs. The SBTT structure also requires no gate insulator. This property alleviates the requirement of a thin gate insulator with a high dielectric constant, low gate leakage, and low interface state density. The SBTT fabrication process is compatible with conventional silicon CMOS technologies. The SBTT process is simpler and costs less than a CMOS process because the SBTT process requires less photo masking steps than a CMOS process. The emitter and the collector can be made of the same metal or silicide material for both n- and p-channel SBTTs, while MOSFETs require separate implantations and photo masking steps for the n+ S/D junctions of n-channel MOSFETs and the p+ S/D junctions of p-channel MOSFETs. The metals and silicides, such as Ti, Ta, Co, Ni, W, $WSi_2$, $CoSi_2$, $NiSi_2$, $TiSi_2$, $TaSi_2$, and $MoSi_2$, are commonly used in the silicon CMOS technologies. The material properties of the above metals and silicides are well known. The process equipment and the process technologies are readily available. Two manufacturing processes are described below to fabricate horizontal and vertical SBTTs using the technologies compatible with the conventional silicon CMOS technologies.

Another advantage of the invention is that a SBTT is smaller than a MOSFET, allowing more SBTTs to be packed on the same chip area than MOSFETs. The MOSFET is a four-terminal device, which requires a substrate contact to provide the body bias. The SBTT is a three-terminal device and does not need the substrate contact. The substrate contacts for CMOS devices are sometimes called well taps because n-channel MOSFETs are usually built in p-wells and p-channel MOSFETs are usually built in n-wells. The p-well is normally tied to the ground and the n-well is normally tied to $V_{dd}$. Although the well tap is not required for every single transistor, however, from the latch-up concern, the well taps are preferably to be placed as close to the device as possible. The source/drain contacts of a MOSFET are metal-to-semiconductor contacts. The contact resistance increases with shrinking the contact size. Typically, it is recommended to put as many source/drain contacts as possible to reduce the total contact resistance. The emitter and the collector of a SBTT are made of metals or silicides, the contact resistances between interconnect lines and the emitter/collector regions are negligible. That means the number of emitter/collector contacts of a SBTT can be smaller than the number of source/drain contacts of a MOSFET. The conductive materials for the SBTT's emitter/collector regions can also be used as local interconnects to connect adjacent devices. The local interconnects provide an additional degree of design freedom at no additional cost. In the silicon CMOS technologies, the following materials, such as TiN, TiSi2, polysilicon, and polycide, have been used as local interconnects, however, at the cost of one additional photo mask.

The invention SBTT devices provide I–V characteristics similar to MOSFETs and bipolar transistors. The SBTT devices can be used in both digital and analog circuit designs. For digital applications, all people need is a three-terminal switch where the conductance between two terminals is strongly controlled by the third. For the MOS device, the drain-to-source conductance is controlled by the gate voltage. For the bipolar transistor and SBTT, the collector-to-emitter conductance is controlled by the base voltage. The device simulation shows that the turn-on behavior of a SBTT is strongly dependent on the base voltage, which indicates the SBTT is suitable for low-power and high-speed applications. The analog design using SBTT devices resembles the traditional analog design using bipolar transistors because both devices have exponential relationships between the collector current and the base voltage.

The details of one or more embodiments are set forth in the accompanying drawing and in the description below. Other features, objects, and advantages of the invention will become apparent from the description and drawings, and from the claims.

BRIEF DESCRIPTION OF THE DRAWINGS

The accompanying drawing, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
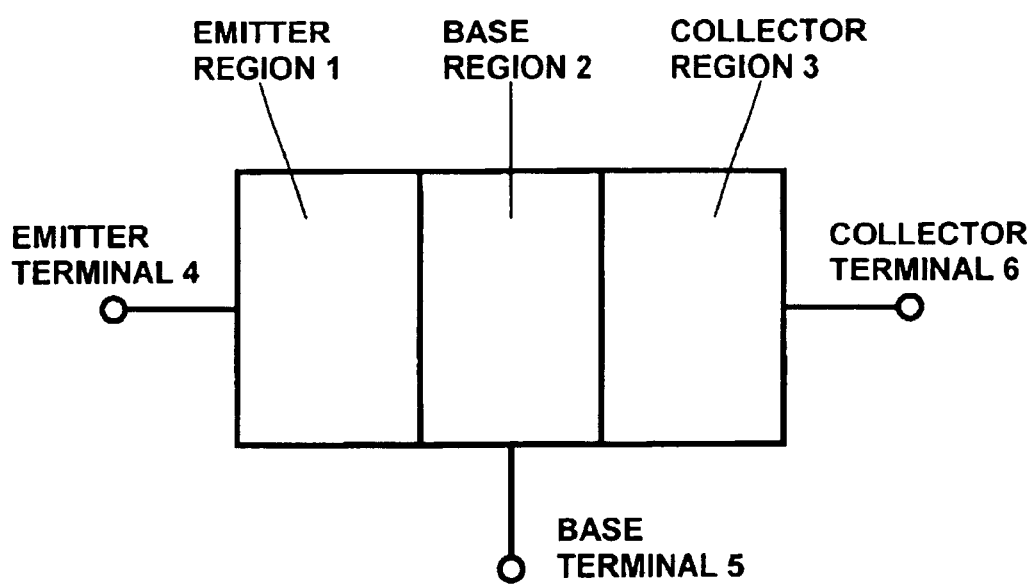
FIG. 1 is a schematic drawing of a SBTT in accordance with the present invention.

The Schottky-barrier tunneling transistor (SBTT) has a metal-semiconductor-metal sandwich structure. The schematic drawing of the device structure is shown in FIG. 1. The structure consists of three regions—the emitter region 1, the base region 2, and the collector region 3. SBTT has three terminals—the emitter terminal 4, the base terminal 5, and the collector terminal 6. In accordance to the present invention, a terminal, or an electric terminal, or an electrode refers to an electric contact that can connect a region of the semiconductor device to the external circuit. A terminal is formed by an electrically conductive material such as a metal.

The base region 2 is made of a semiconductor such as silicon, germanium, and compound semiconductors. The emitter region 1 and the collector region 3 are made of metals (such as W, Ti, Ta, Mo, and Pt), metal compounds (such as TiN and TaN), or silicides (such as PtSi, $TiSi_2$, and $CoSi_2$). The emitter region 1 and the collector region 3 are not necessary to be made of the same material. However, for the sake of process simplicity, the emitter region 1 and the collector region 3 can be made of the same material. A Schottky junction is created by intimate contact of a metal (or a silicide) and a semiconductor. The emitter-base and the collector-base junctions are metal-semiconductor Schottky junctions.

In another aspect of the present invention, FIG. 1 illustrates a three-terminal semiconductor transistor device comprises a semiconductor base region 2 in contact with a first electric terminal (base terminal 5), a conductive emitter region 1 in contact with the semiconductor base region 2, forming a first Schottky barrier junction at the interface of the conductive emitter region 1 and the semiconductor base region 2. The conductive emitter region 1 is in contact with a second electric terminal (emitter terminal 4). The three-terminal semiconductor transistor device further includes a conductive collector region 3 in contact with the semiconductor base region 2, forming a second Schottky barrier junction at the interface of the conductive collector region 3 and the semiconductor base region 2. The conductive collector region 3 is in contact with a third electric terminal (collector terminal 6). The tunneling currents through the first and the second Schottky barrier junctions are substantially controlled by the voltage of the semiconductor base region 2.

Although the three terminals of a SBTT are named as emitter, base, and collector, the same terminal names as a bipolar transistor, the SBTT is fundamentally different from the bipolar transistor. The emitter region and the collector region in a SBTT are formed by conductive materials, and not by semiconductor materials as in a bipolar transistor. The emitter-base and collector-base junctions are Schottky junctions for a SBTT. Those junctions are semiconductor p-n junctions for a bipolar transistor. SBTT is not a field effect transistor either. Hence the terminal names of a SBTT are different from the terminal names (source, drain, and gate) of an FET. For a field effect transistor, the gate is isolated from the channel by an insulator (such as the gate oxide in a MOSFET) or a reverse biased junction (such as the gate junction in a JFET or a MESFET). The insulated gate provides important benefits for a field effect transistor— negligible gate current and almost infinite input resistance. The gate leakage current, however, becomes not negligible as the gate oxide thickness is reduced to atomic layer dimensions.

The SBTT has two complementary device types—n-channel and p-channel, which are similar to the MOSFET. The primary carriers are electrons in an n-channel SBTT, and holes in a p-channel SBTT. The two complimentary device types are important to reduce the power consumption. The complimentary MOS (CMOS) technology is very successful today partially because of its low power consumption. For a CMOS digital circuit, the DC power consumption is zero except the power consumption caused by the leakage current. It only consumes power during the AC switching mode.

Figure 2A:
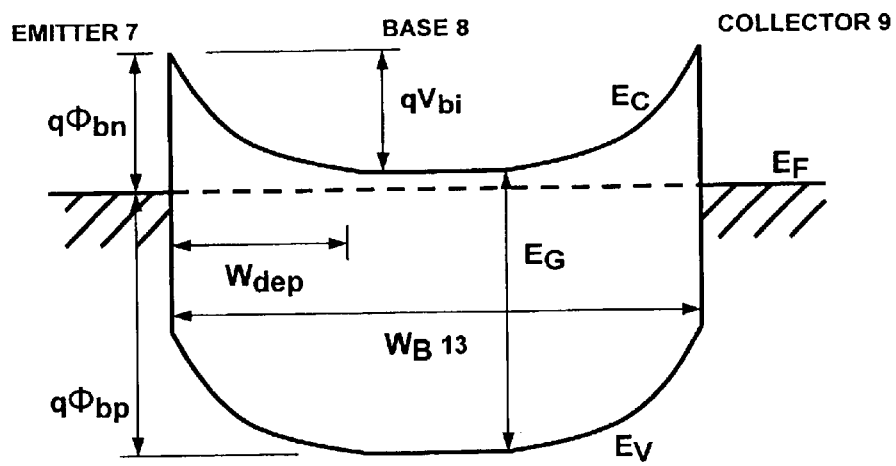
FIG. 2a is the band diagram of a wide-base n-channel SBTTs at equilibrium in accordance with the present invention.
Figure 2B:
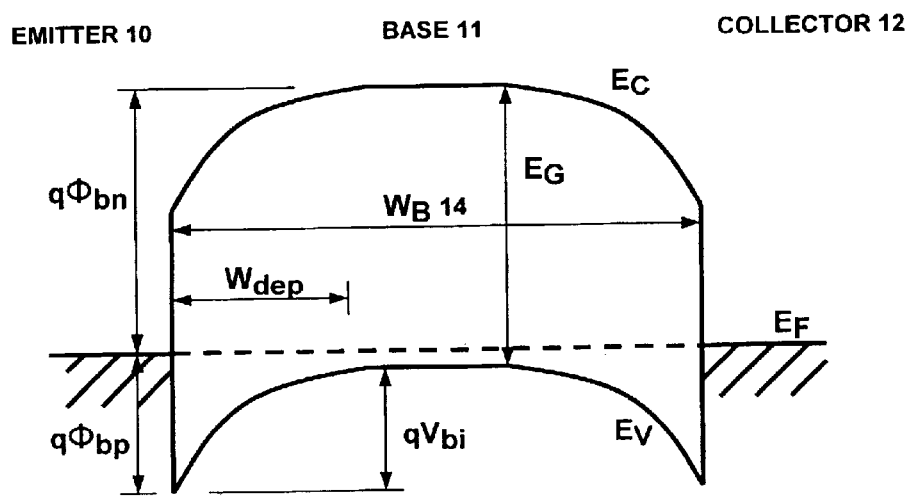
FIG. 2b is the band diagram of a wide-base p-channel SBTTs at equilibrium in accordance with the present invention.

The band diagrams of wide-base n- and p-channel SBTTs at equilibrium are shown in FIGS. 2a and 2b, respectively. The n-channel SBTT consists of the emitter region 7, the base region 8, and the collector region 9. The p-channel SBTT consists of the emitter region 10, the base region 11, and the collector region 12. For an illustration purpose, the base widths 13 and 14 are made very large to study the band diagrams under different bias conditions. In FIGS. 2a and 2b, $E_G$ is the band gap of the base semiconductor, $E_C$ is the conduction band edge, $E_V$ is the valence band edge, $E_F$ is the Fermi level, $q\phi_{bn}$ is the potential barrier for the electrons in the metals to cross the Schottky junction to the base, $q\phi_{bp}$ is the potential barrier for the holes in the metals to cross the Schottky junction to the base, $W_B$ is the base width, $W_{dep}$ is the depletion layer width of the Schottky junction, and $V_{bi}$ is the built-in voltage. The Fermi level, $E_F$, is constant throughout the device at thermal equilibrium. The potential barrier height for electrons, $q\phi_{bn}$, is the conduction band discontinuity between the metal and the semiconductor. The potential barrier height for holes, $q\phi_{bp}$, is the valence band discontinuity between the metal and the semiconductor. The base widths 13 and 14 are intentionally made larger than the total depletion layer widths of the two Schottky junctions.

The main difference between the device structures of n-channel and p-channel SBTTs is the base dopant type. The base region 8 is n-type doped for an n-channel SBTT, and the base region 11 is p-type doped for a p-channel SBTT.

Figure 3A:
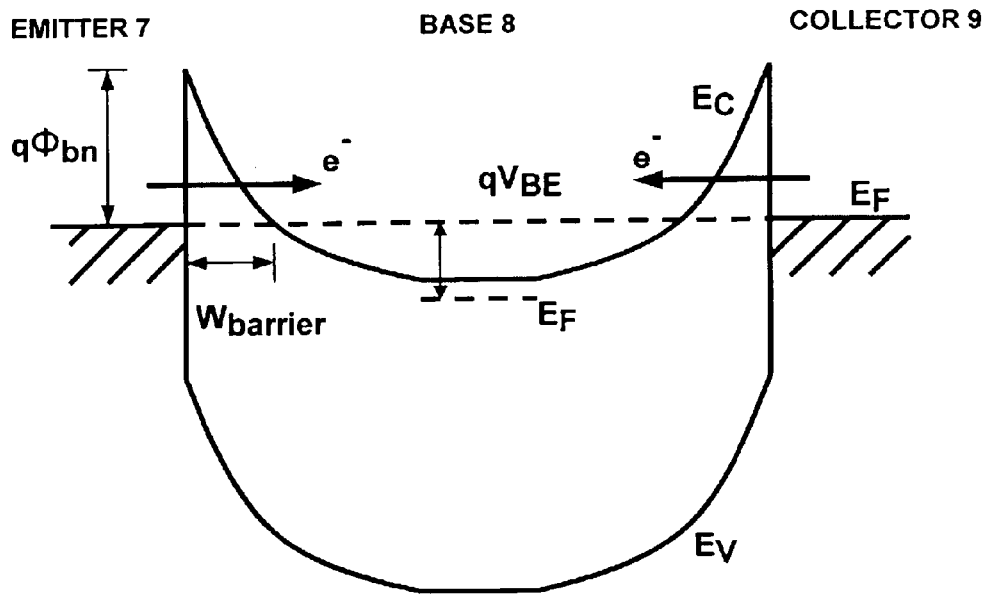
FIGS. 3a–b are the band diagrams of a wide-base n-channel SBTT under different bias conditions in accordance with the present invention.
Figure 3B:
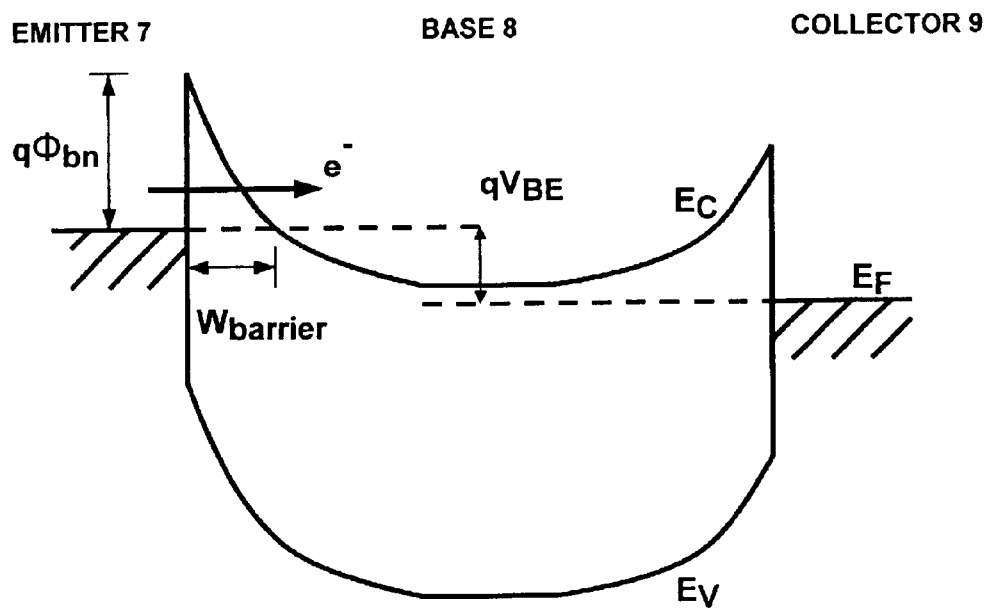

FIGS. 3a and 3b show the band diagrams of an n-channel wide-base SBTT under different bias conditions. When the base 8 is positively biased, $V_B>0$ V, and the emitter 7 and the collector 9 are grounded, $V_E=V_C=0$ V, the band structure is bent down in the base region 8, as shown in FIG. 3a. The emitter-base barrier width, $W_{barrier}$, is reduced. The barrier height $q\phi_{bn}$ is also reduced due to the Schottky effect (not shown in FIG. 3a). The Schottky effect is the image-force-induced lowering of the potential energy for charge carrier emission when an electric field is applied. If the base voltage is sufficiently large, the potential barrier width becomes small and electrons tunneling from emitter to base become possible. The emitter-base Schottky barrier therefore becomes a low-resistance ohmic contact.

When the base 8 and the collector 9 are both positively biased, for example, $V_B=V_C>0$ V and $V_E=0$ V. The band diagram is shown in FIG. 3b. The emitter-base barrier width, $W_{barrier}$, is reduced by a positive base voltage. Electrons can tunnel from the emitter to the base. For a wide-base device, most injected electrons are recombined in the base region. Only a small fraction of electrons can transport through the base region 8 and reach the collector region 9. The base transport factor, $\alpha_T$, is low because of the carrier recombinations in the wide base region 8. To improve the current gain of the transistor, the base width must be reduced so that most carriers can transport through the base region 8 without recombinations.

Figure 4A:
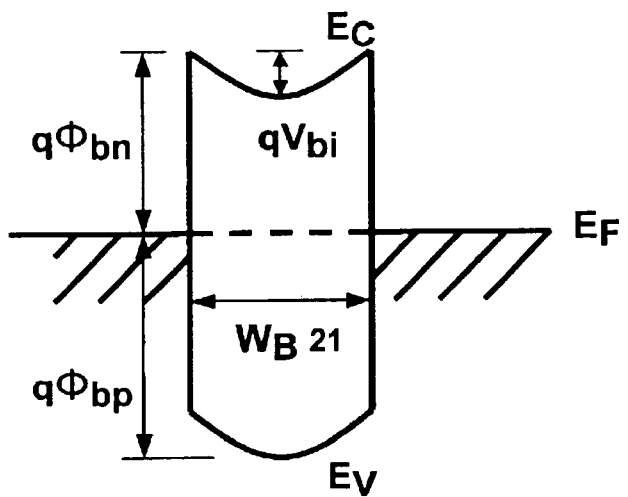
FIG. 4a is the band diagram of a narrow-base n-channel SBTT at equilibrium in accordance with the present invention.
Figure 4B:
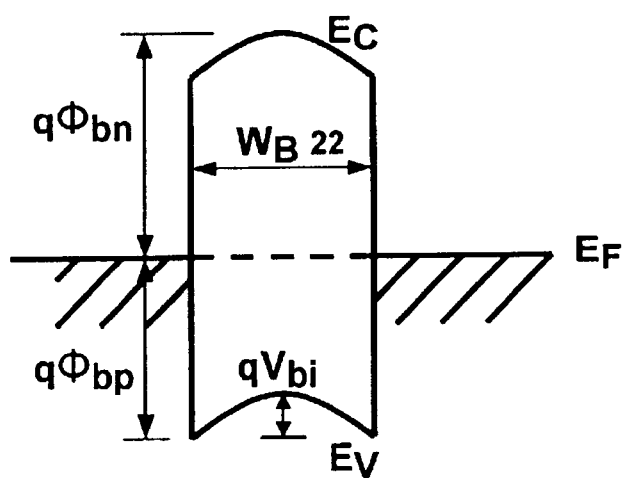
FIG. 4b is the band diagram of a narrow-base p-channel SBTT at equilibrium in accordance with the present invention.

The band diagrams of narrow-base n- and p-channel SBTTs at equilibrium are shown in FIGS. 4a and 4b, respectively. The n-channel SBTT consists of the emitter region 15, the base region 16, and the collector region 17. The p-channel SBTT consists of the emitter region 18, the base region 19, and the collector region 20. In FIGS. 4a and 4b, $E_C$ is the conduction band edge, $E_V$ is the valence band edge, $E_F$ is the Fermi level, $q\phi_{bn}$ is the potential barrier for the electrons in the emitter to cross the Schottky junction to the base, $q\phi_{bp}$ is the potential barrier for the holes in the emitter to cross the Schottky junction to the base, $W_B$ is the base width, and $V_{bi}$ is the built-in voltage. The Fermi level is constant throughout the device in thermal equilibrium. The potential barrier height for electrons, $q\phi_{bn}$, is the conduction band discontinuity between the metal and the semiconductor. The potential barrier height for holes, $q\phi_{bp}$, is the valence band discontinuity between the metal and the semiconductor.

For narrow-base devices, the base widths 21 and 22 are smaller than the total depletion layer widths of the emitter-base and collector-base Schottky junctions. The band bendings are different from those of wide-base SBTTs. At thermal equilibrium, the base regions 16 and 19 are completely depleted. The built-in voltages, $V_{bi}$, are smaller than those of wide-base SBTTs.

The base region 16 is n-type doped for an n-channel SBTT, and the base region 19 is p-type doped for a p-channel SBTT. The doping concentration is typically in the range between $10^{18}$ and $5\times10^{21}$ cm$^{-3}$. Since the base widths 21 and 22 are small, typically less than 1000 Å, most carriers injected from the emitter region 15 and 18 can transport through the base regions 16 and 19 to the collector regions 17 and 20 without recombinations. The emitter-base and collector-base junctions are Schottky barrier junctions even the base regions 16 and 19 are heavily doped because of the complete depletion in the base regions 16 and 19.

Figure 5A:
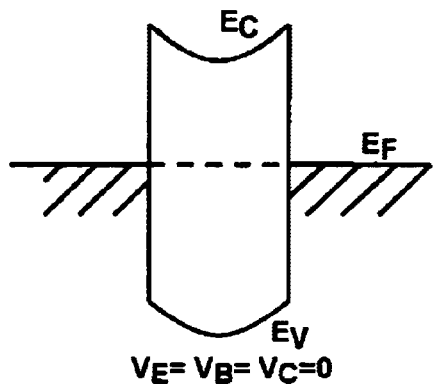
FIGS. 5a–d are band diagrams of a narrow-base n-channel SBTT under different bias conditions in accordance with the present invention.
Figure 5B:
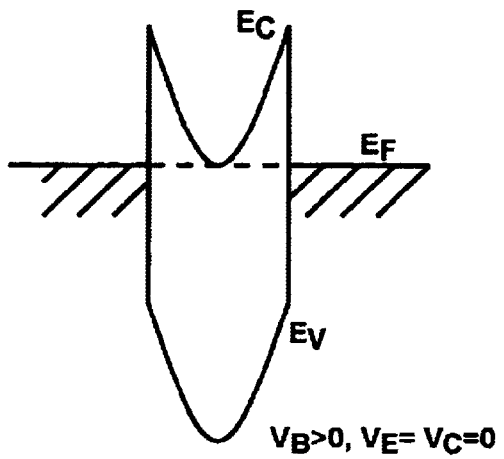

FIGS. 5a–d show the band diagrams of a narrow-base n-channel SBTT under various bias conditions: (a) thermal equilibrium, $V_E=V_B=V_C=0$ V, (b) $V_B>0$ V and $V_E=V_C=0$ V, (c) $V_C>0$ V and $V_E=V_B=0$ V, and (d) $V_B=V_C>0$ V, $V_E=0$ V. When the base is positively biased as shown in FIG. 5b, the band bends down in the base region 16. The potential barrier widths of emitter-base and collector-base Schottky junctions are then reduced. The potential barrier heights are also reduced (not shown in the figures) due to the Schottky effect. When the potential barrier widths and barrier heights are small enough, electrons tunneling across the Schottky barriers become possible. Current will flow when a positive collector voltage is applied, corresponding to the "ON" state. The emitter-base and collector-base Schottky junctions become low-resistance ohmic contacts, which allow a large current to flow with a small voltage drop. Since the base width 21 is small and the electrons are the majority carrier in the base region 16, most injected electrons are not recombined in the base region 16. The device is turned on when the base voltage is larger than the turn-on voltage. The base turn-on voltage is similar to the threshold voltage of a MOSFET.

Figure 5C:
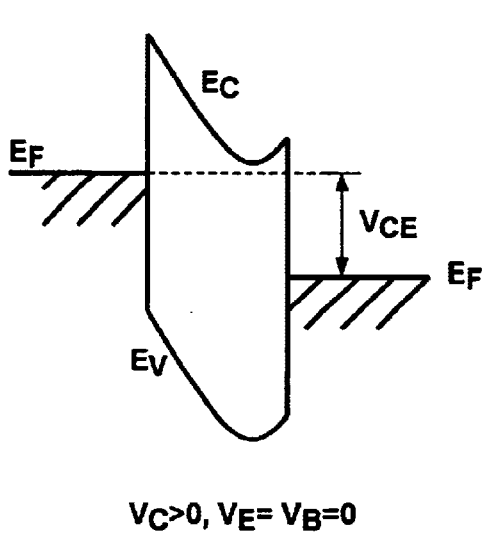

When the collector is positively biased, for example, $V_C=V_{dd}$, the band diagram is shown in FIG. 5c. The band is bent down in the collector region 17. The barrier height $q\phi_{bn}$ and the barrier width of the emitter-base Schottky junction need to be large enough to block the electrons flowing from the emitter region 15 to the base region 16. The case corresponds to the "OFF" state of the transistor. When the collector voltage is further increased, the barrier width and the barrier height will be further reduced. Eventually electrons will be able to tunnel through the emitter-base potential barrier and reach the collector region 17. In this case, the collector-to-emitter punchthrough is caused by a large collector voltage. The collector-to-emitter punchthrough is similar to the drain-to-source punchthrough of a short-channel MOSFET. The drain-to-source punchthrough is caused by the drain-induced-barrier-lowering effect, in which the potential barrier between the source and the drain is lowered down by the drain voltage. It is very important to design the SBTT device structure so that the transistor remains at the OFF state when $V_{dd}$ is applied to the collector. The device parameters such as base width, base doping, emitter and collector Fermi levels, Schottky barrier heights, and power supply voltage should be carefully chosen to suppress the collector-to-emitter punchthrough.

Figure 5D:
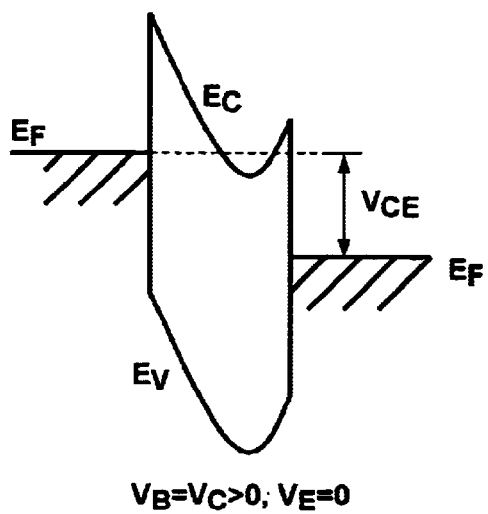

When both the base and the collector are positively biased, the band diagram is shown in FIG. 5d. The barrier widths of the emitter-base and the collector-base Schottky junctions are reduced. Electrons can tunnel through the emitter-base barrier and reach the collector region 17. The electron with a higher energy has a larger quantum transmission coefficient to tunnel through the emitter-base Schottky barrier. The high-energy electrons will be quickly swept to the collector by the electric field in the base region. Because the base width 21 is small and carriers are depleted in the base region 16, most electrons can transport through the base region 16 without recombinations.

A two-dimensional (2-D) numerical simulator was developed specifically for the SBTT structure. The 2-D simulator consists of self-consistent loop for the solution of the Poisson equation and the current continuity equations. The carrier injection across the Schottky barrier by tunneling is handled by using the transmission probability, which is the solution of the Schrodinger equation. The injection current is then used as the boundary condition for the next iteration cycle. The loop stops when the maximum difference of the potential between two consecutive iterations is smaller than the prescribed convergence criterion.

The device simulation shows the SBTT has very different physical behaviors from the conventional MOSFET and bipolar transistor. Carrier flow from the emitter terminal 4 to the base region 2 takes place mainly by tunneling through the emitter-base Schottky barrier. The barrier width is spatially modulated by the base voltage. When the base voltage is small, the barrier between emitter and base is sufficiently wide, so that little tunneling takes place. When the base voltage is sufficiently large, the barrier width is reduced and tunneling occurs.

Figure 6:
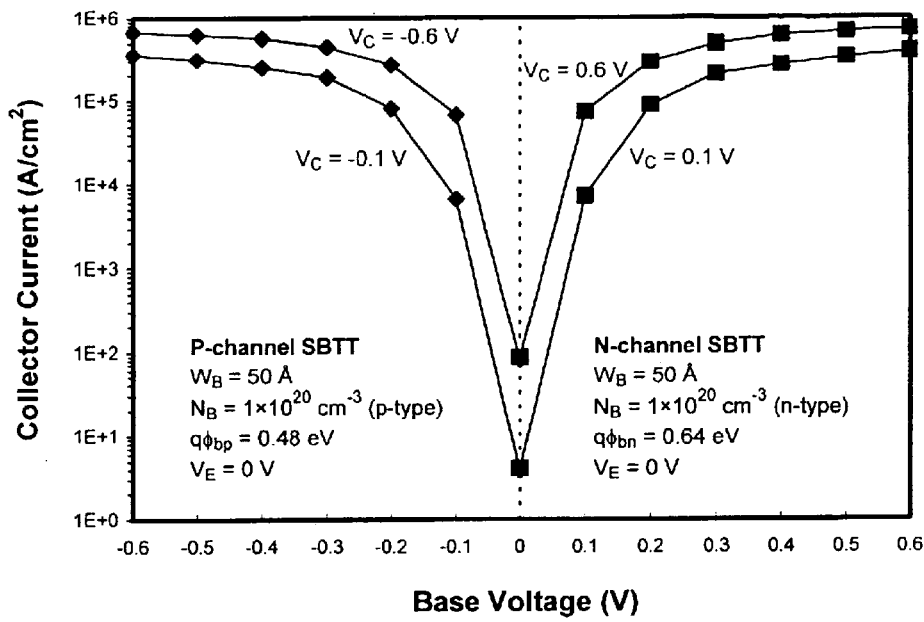
FIG. 6 is a plot of simulated $I_C$–$V_B$ in logarithm scale for n- and p-channel SBTTs in accordance with the present invention.
Figure 7:
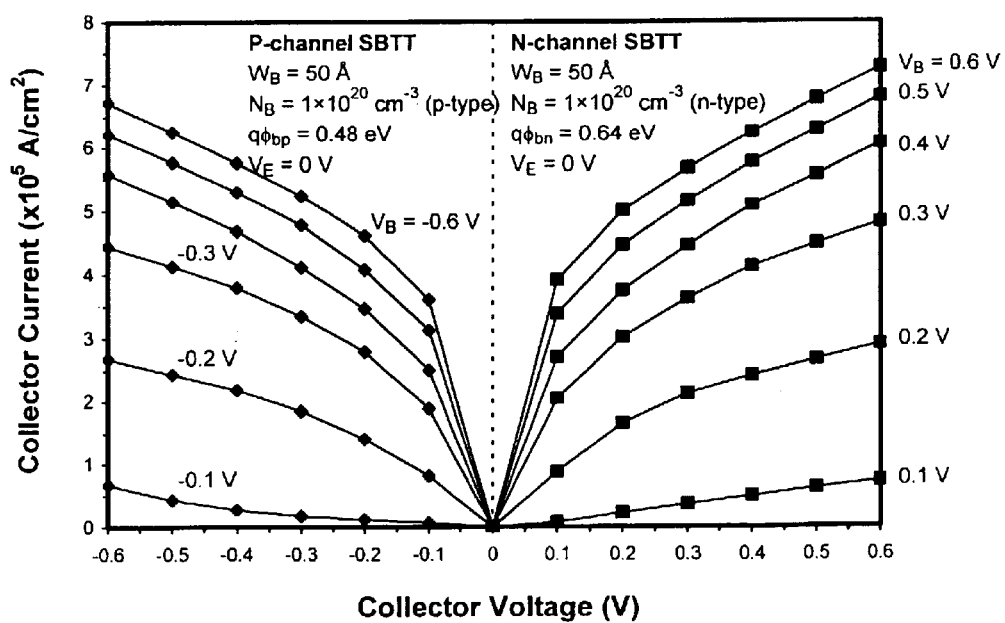
FIG. 7 is a plot of simulated $I_C$–$V_C$ in linear scale for n- and p-channel SBTTs in accordance with the present invention.

FIGS. 6 and 7 show the simulated I–V characteristics for both n- and p-channel SBTTs. The SBTTs have a base width of 50 Å and a base doping density of $10^{20}$ cm$^{-3}$. The base is n-type doped silicon for the n-channel device and p-type doped silicon for the p-channel device. The emitter is grounded in the simulations. The Schottky barrier height for electrons, $q\phi_{bn}$, is 0.64 eV for the n-channel device. The Schottky barrier height for holes, $q_{bp}$, is 0.48 eV for the p-channel device. The same material is used for the emitter and the collector of both n- and p-channel SBTTs. The work function of the emitter/collector material is 4.69 eV, which is slightly below the silicon mid band gap by 0.08 eV, because electrons have higher effective Richardson constant and smaller effective mass than holes. The simulation results demonstrate a single material can be used for the emitter/collector Schottky junctions and still produces symmetric I–V characteristics for both n- and p-channel SBTTs. That means the SBTT fabrication process can be greatly simplified compared to a CMOS process. In a CMOS process, the doping profile of the drain junction needs to be independently optimized for the n- and p-channel devices.

FIG. 6 shows $I_C$–$V_B$ characteristics in logarithm scale for n- and p-channel SBTTs. The collector current initially increases exponentially with the base voltage. When the base voltage increases, the emitter-base Schottky barrier width is reduced and the tunneling current is enhanced. The collector current shows an exponential dependence on the base voltage until the current is limited by the injection efficiency through the emitter-base Schottky barrier. The slope in the exponential region is much steeper than that of a MOSFET. The SBTT is very sensitive to the base voltage. A small base voltage, for example, 0.2 V, is enough to turn on a SBTT. The power supply voltage is therefore can be further reduced.

The exponential relationship between the driving current and the control voltage is similar to the subthreshold region of a MOSFET, in which the drain current is an exponential function of the gate voltage. The gate voltage swing, which is defined by the subthreshold slope, is a measure of the gate voltage to switch a MOSFET between ON and OFF states. The theoretical minimum limit of a subthreshold slope is 60 mV/dec at room temperature. The actual subthreshold slope from silicon is around 100 mV/dec due to interface states and the poly-gate depletion capacitance. The difference between ON and OFF currents is required to be at least 4 orders of magnitude, otherwise, the leakage current would be either too high or the driving current is too small. That means the power supply voltage for MOS devices must be larger than 0.4 V even the device dimensions can be scaled down to atomic levels. The power supply voltage is a fundamental limit for scaling down MOS devices. The power supply voltage for the SBTT can be more aggressively reduced, so the SBTT is more qualified as a future device than the MOSFET.

FIG. 7 shows $I_C$–$V_C$ characteristics for n- and p-channel SBTTs. The driving current of n- and p-channel devices are very similar because the metal work function is closer to the valence band than the conduction band in order to compensate the difference in the tunneling efficiency between electrons and holes. When the collector voltage increases, the emitter-base Schottky barrier width is reduced and the tunneling current is enhanced. Since the base width is very small, 50 Å, the collector current increases continuously with the collector voltage. The collector current never saturates in the voltage range used in the simulations.

The device simulation shows a very interesting behavior of a SBTT. Most of the collector-to-emitter voltage drop $V_{CE}$ is across the emitter-base Schottky barrier, which is very different from a MOSFET or a bipolar transistor. For a MOSFET, most of the drain-to-source voltage is across the drain junction. Since the drain junction is reverse biased in the normal operation mode. The increase of the drain voltage will increase the depletion layer width of the drain junction, which has little effect on the drain current. The drain current is almost independent of the drain voltage in the saturation region.

From the device simulation, the thermionic emission current is negligible in the device turn-on mode. The tunneling current can be many orders of magnitude larger than the thermionic emission current. The key point that the thermionic emission current does not contribute much to the leakage current is the dopant type in the base. For an n-channel SBTT, the base is n-type doped. A positive base voltage is used to turn on the device. The Schottky barrier junctions are reverse biased, and the thermionic emission currents are negligible.

For the MOS devices, the minimum gate length is continuously scaled down for better performance. The power supply voltage, $V_{dd}$, will be required to scaled down in the future technologies to maintain a constant electric field in the channel to control the short-channel effect, hot carrier injection, and the power dissipation. $V_{dd}$ is expected to be 0.6 V for the 32-nm technology in 2013 according to the ITRS roadmap. For the SBTT, the operating voltage can be reduced if the Schottky barrier height and width are reduced so that the device can be turned on at a smaller base voltage. A large Schottky barrier helps to reduce the "OFF" state leakage current, but a smaller Schottky barrier enhances the "ON" state tunneling current and reduces the requirement on the power supply voltage. If the metal Fermi level of the emitter is close to the conduction band edge of the base semiconductor for an n-channel device, the Schottky potential barrier for electrons, $q\phi_{bn}$, can be reduced. Similarly, if the metal Fermi level of the emitter is close to the valence band edge of the base semiconductor for a p-channel device, the Schottky potential barrier for holes, $q\phi_{bp}$, can be reduced. In this case, the emitter materials are different for n- and p-channel SBTTs in order to optimize the device performance individually. The potential barrier width can also be modulated by the base doping, because the depletion layer width is a function of the base doping. A reasonable compromise can be reached between junction isolation and driving current by choosing the Schottky barrier height, base width, and base doping concentration.

For the simplicity of the fabrication process, the SBTT can have the same material for the emitter and the collector, and the emitter-base and collector-base potential barriers are the same. In addition, both n- and p-channel devices can have the same material for their emitters and collectors. In the above device simulations, the metal work function is slightly below the silicon mid band gap to compensate the differences in the effective Richardson constants and the effective masses between electrons and holes. In this case, the electron potential barrier of an n-channel SBTT is larger than the hole potential barrier of a p-channel SBTT, i.e. $q\phi_{bn} > \frac{1}{2} E_G > q\phi_{bp}$, so that n- and p-channel devices have symmetric I–V characteristics.

For most covalent and III–V compound semiconductors, such as Si, GaAs, and GaP, the surfaces have a high peak density of surface states near one-third of the band gap from the valence band edge. The surface Fermi level is pinned at the one-third of the band gap. The barrier height is essentially independent of metal work function. For ionic semiconductors, such as CdS and ZnS, the barrier height generally depends strongly on the metal; and a correlation has been found between the interface behavior and the electronegativity, $X_M$. The electronegativity $X_M$ is defined as the power of an atom to attract electrons.

The metal silicides formed by solid-solid metallurgical reaction between the transition metals and silicon provide reliable and reproducible Schottky barriers, because the interface chemical reactions are well defined and can be maintained under good control. The Schottky barrier height is found to be a linear function of the heat of silicide formation $\Delta H$. Appropriate silicides can be found with desirable Schottky barrier heights. For example, the Fermi level of PtSi is close to the valence band edge, $q\phi_{bp}=0.24$ eV, and the Fermi level of ErSi$_{1.7}$ is close to the conduction band edge, $q\phi_{bn}=0.28$ eV. The Fermi levels of some commonly used silicides such as WSi$_2$, CoSi$_2$, NiSi$_2$, TiSi$_2$, TaSi$_2$, CrSi$_2$, MoSi$_2$, and RhSi$_2$ are slightly below the silicon mid band gap, $q\phi_{bn}=0.56-0.7$ eV.

The SBTT is more scalable than the MOSFET for the future small geometry device. For a MOSFET, the channel inversion layer is induced by the gate bias. The gate is separated from the channel by a gate insulator. The thickness of the gate insulator needs to be continuously scaled down so that the device can be shrunk to a smaller geometry. Currently there is no known solution to produce a gate insulator with an equivalent oxide thickness less than    Å and with low leakage current. Unlike the MOSFET, which requires a thin gate insulator with low interface trap density and low leakage current, the SBTT structure does not have the gate insulator. The SBTT has two Schottky barriers at the emitter-base and collector-base junctions. The terminal currents are modulated by the base voltage. The SBTT is turned on by applying a positive base voltage to an n-channel device, and a negative base voltage to a p-channel device.

For a MOSFET, the source/drain extensions need to be shallow in order to improve the short-channel effect. The contact size also needs to be shrunk to reduce the transistor size. The device performance will be degraded by the increasing series resistances from the shallow source/drain extensions and small contacts. For the SBTT, the emitter region 1 and the collector region 3 are made of metals or suicides, which are much more conductive than semiconductors. The metal resistivity is typically in the range of 1–15 $\mu\Omega$-cm for different metals. The silicide resistivity is typically in the range of 10–100 $\mu\Omega$-cm for different suicides. The silicon resistivity is in the range of $10^2$–$10^5$ $\mu\Omega$-cm for the doping concentration of $10^{17}$–$10^{21}$ cm$^{-3}$. Only the base requires a traditional metal-to-semiconductor ohmic contact. Since the majority of the device current flows between the emitter and the collector, the base current is relatively small. The base contact resistance and base series resistance will not significantly degrade the device performance.

Two manufacturing processes to fabricate the SBTTs are described below. In the first process, the SBTT is implemented as a horizontal device, i.e. the emitter-base-collector structure is in a horizontal direction. In the second process, the SBTT is implemented as a vertical device, i.e. the emitter-base-collector structure is in a vertical direction.

Figure 8:
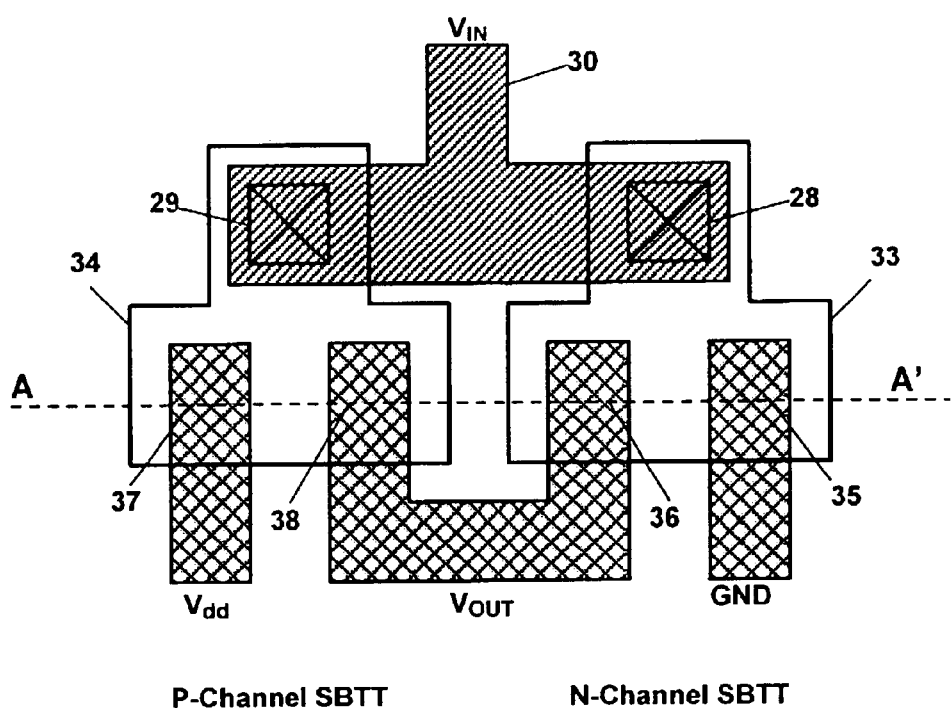
FIG. 8 is the top view of an inverter circuit consisting of one n-channel SBTT and one p-channel SBTT.

FIG. 8 shows the top view layout of an inverter circuit using horizontal SBTTs. The inverter circuit consists of one n-channel SBTT and one p-channel SBTT. The n-type doped active area 33 is the base region of the n-channel device. The p-type doped active area 34 is the base region of the p-channel device. The emitter electrode 37 of the p-channel SBTT is connected to $V_{dd}$. The emitter electrode 35 of the n-channel SBTT is connected to ground. The collector electrode 36 of the n-channel device and the collector electrode 38 of the p-channel device are connected the output, $V_{OUT}$. The electrodes can be used as local interconnects to connect adjacent devices. For example, the collector electrode 36 of the n-channel device and the collector electrode 38 of the p-channel device are connected together and become the output of the inverter by using the emitter/collector electrodes as local interconnects. The input 30 of the inverter is connected to the base 33 of the n-channel SBTT through the base contact 28. The input 30 is also connected to the base 34 of the p-channel SBTT through the base contact 29. The base contacts (28 and 29) should be good ohmic contacts with low resistance. To achieve good ohmic contacts to the base regions, the contact areas need to be heavily doped to reduce the contact resistance. In the field area, which is outside the active areas (33 and 34), the semiconductor layer is removed and filled with an insulating material, such as silicon dioxide, to provide device isolation. Common base devices of the same type, for example, n-channel or p-channel, can share a common base region.

Figure 9A:
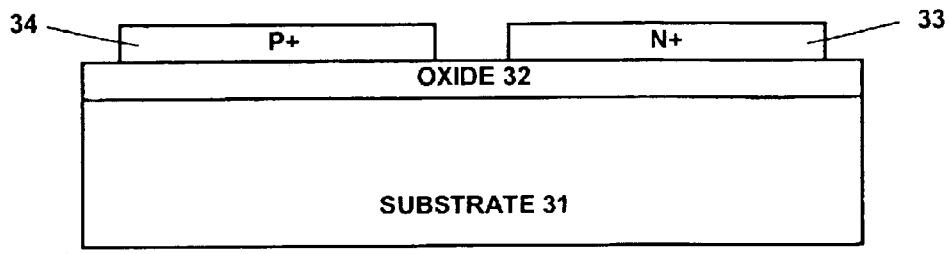
FIGS. 9a–c are cross-sectional views illustrating steps for fabricating horizontal SBTTs along the A–A' line in FIG. 8 in accordance with the present invention.
Figure 9B:
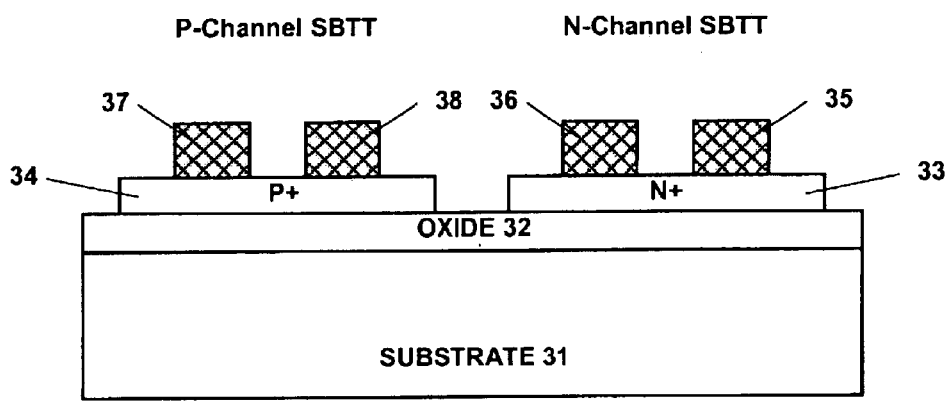
Figure 9C:
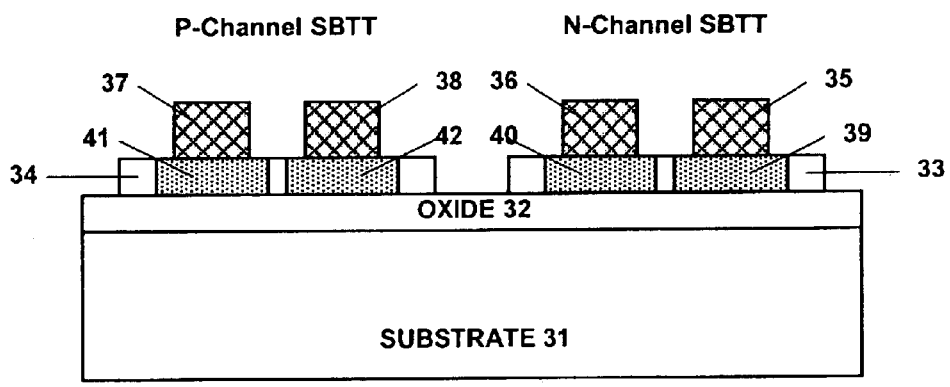
Figure 10:
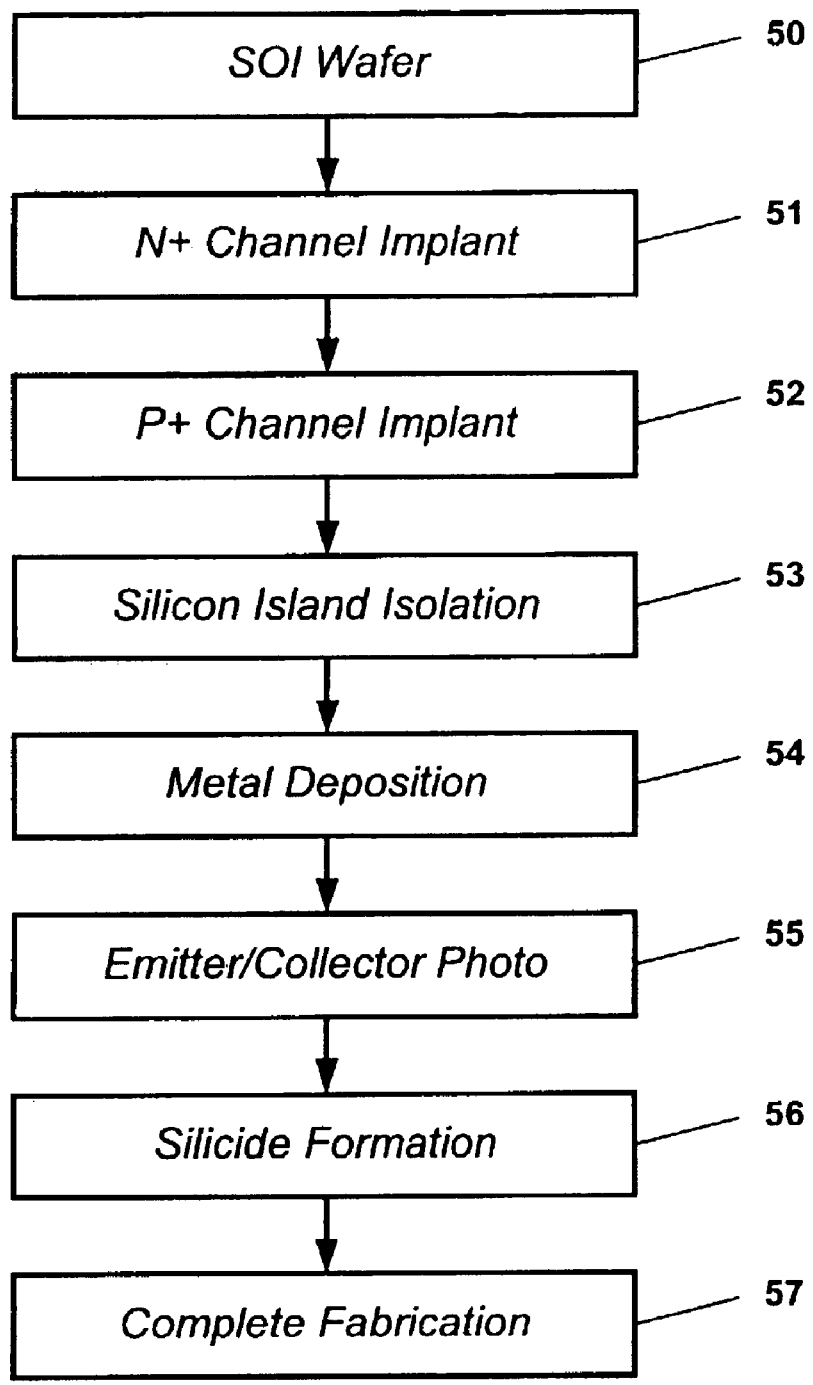
FIG. 10 shows the process steps of fabricating horizontal SBTTs as shown in FIG. 9c.

FIG. 10 shows the process steps of fabricating horizontal SBTTs. Referring to the drawings in more details, and in particular to FIGS. 9a—c, there are shown cross-sectional views taken along the A—A' line in FIG. 8 in the various processing steps that are employed in the present invention for fabricating horizontal SBTTs.

The starting material is a silicon-on-insulator (SOI) wafer (step 50). FIG. 9a shows a cross-sectional view of the initial structure that is employed in the first implementation. The structure shown in FIG. 9a comprises a silicon substrate 31 having a first oxide layer 32 formed over one of its surface. The single crystal silicon layer, with a thickness of about 150 Å, is separated from the substrate 31 by an insulating layer of silicon dioxide 32, with a thickness of about 500 Å. The silicon 33 is doped by n-type impurities, such as arsenic or phosphorus, through the implantation process (step 51), in the n-channel SBTT area. The silicon 34 is doped by p-type impurities, such as boron, through the implantation process (step 52), in the p-channel SBTT area. The silicon in the field area is removed by the etch process for device isolation (step 53). The active areas of single crystal silicon are formed silicon islands on the silicon dioxide 32 surface.

A layer of metal, with a thickness of about 1500 Å, is deposited (step 54) on the wafer by the method of sputtering or chemical vapor deposition (CVD). The metal is patterned by a photolithographic process (step 55) to form the emitter electrode 35 and the collector electrode 36 of an n-channel SBTT and the emitter electrode 37 and the collector electrode 38 of a p-channel SBTT, as shown in FIG. 9b.

The wafer is heated to a high temperature, such as 950° C., for about 60 seconds to form metal silicide (step 56), as shown in FIG. 9c. In the silicidation process, metal reacts with silicon to form silicide. The metal silicide regions are the emitter region 39 and the collector region 40 of an n-channel SBTT. The metal silicide regions are the emitter region 41 and the collector region 42 of a p-channel SBTT. The base width is the distance between the emitter and the collector silicide regions. The base width needs to be small in order to reduce the carrier recombination in the base region. Before the silicidation process (step 56), the minimum space between the collector and the emitter electrodes is determined by the photolithographic resolution. Since silicon is consumed in the silicidation process, the base width can be much smaller than the photolithographic resolution after the silicidation process.

The metal spaces, between the emitter electrode 35 and the collector electrode 36 of an n-channel device and between the emitter electrode 37 and the collector electrode 38 of a p-channel SBTT, are defined by the photolithographic and etch processes. If the metal spaces can meet the dimensional requirement of the base width, the above silicidation process (step 56) can be skipped. The above silicidation process (step 56) is an optional step.

In another aspect of the present invention, FIG. 9c illustrates a three-dimensional three-terminal semiconductor device comprising a first insulating substrate layer (the oxide layer 32) and a second substrate layer (the silicon layer 33 and 34) formed above the first insulating substrate layer 32. The second substrate layer (33 and 34) comprises semiconductor base region (the n-type doped base region 33 for n-channel SBTT or the p-type doped base region 34 for p-channel SBTT) in contact with a first electric terminal (the base electrode 30), and a conductive emitter region (the emitter region 39 for n-channel SBTT or the emitter region 41 for p-channel SBTT) in contact with the semiconductor base region (33 or 34), forming a first Schottky barrier junction at the interface of the conductive emitter region (39 or 41) and the semiconductor base region (33 or 34), The conductive emitter region (39 or 41) is in contact with a second electric terminal (the emitter electrode 35 for n-channel SBTT or the emitter electrode 37 for p-channel SBTT). The second substrate layer also comprises a conductive collector region (the collector region 40 for n-channel SBTT or the collector region 42 for p-channel SBTT) in contact with the semiconductor base region (33 or 34), forming a second Schottky barrier junction at the interface of the conductive collector region (40 or 42) and the semiconductor base region (33 or 34). The conductive collector region (40 or 42) is in contact with a third electric terminal (the collector electrode 36 for n-channel SBTT or the collector electrode 38 for p-channel SBTT). The tunneling current through the first Schottky barrier junction or the second Schottky barrier junction is substantially controlled by the voltage of the semiconductor base region (33 or 34).

In accordance to the present invention, a SBTT structure can comprise emitter and collector regions both formed on one side of the base semiconductor layer, as shown in FIG. 9b. For an n-channel SBTT, the emitter-base Schottky junction is formed at the interface between the emitter electrode 35 and the n-type base region 33, and the collector-base Schottky junction is formed at the interface between the collector electrode 36 and the n-type base region 33. For a p-channel SBTT, the emitter-base Schottky junction is formed at the interface between the emitter electrode 37 and the p-type base region 34, and the collector-base Schottky junction is formed at the interface between the collector electrode 38 and the n-type base region 34. In the device structure of FIG. 9b, the base width is not a constant.

In the above process, the emitter and the collector regions are made of the same material for both n- and p-channel SBTTs. The SBTT is therefore a symmetric device whose collector and emitter are interchangeable in the circuit design. In fact, the SBTT has a freedom that the emitter and the collector can be made of the same or different materials. The n- and p-channel devices can also have the same or different materials for their emitter/collector regions. If different materials are used for n- and p-channel devices, the device performance can be optimized individually at the cost of additional photo masking steps.

FIGS. 11 a–g are perspective views illustrating various processing steps in fabricating vertical SBTTs in accordance with the second embodiment of the invention. FIG. 12 shows the process steps of fabricating vertical SBTTs. The starting material is a silicon-on-insulator (SOI) wafer (step 80). FIG. 11a shows a cross-sectional view of the initial structure, which comprises a silicon substrate 61 having a first oxide layer 62 formed over one of its surface. The single crystal silicon layer, with a thickness of about 150 Å, is separated from the substrate 61 by an insulating layer of silicon dioxide 62 with a thickness of about 500 Å. The silicon 63 is doped with n-type impurities, such as arsenic or phosphorus, through the implantation process (step 81), in the n-channel SBTT area. The silicon 64 is doped with p-type impurities, such as boron, through the implantation process (step 82), in the p-channel SBTT area.

Figure 11A:
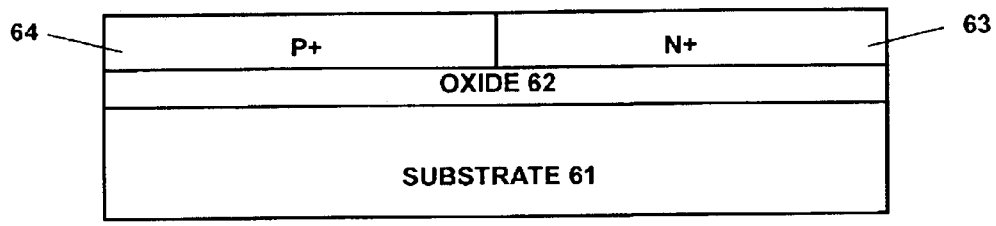
FIGS. 11a–g are cross-sectional views illustrating steps for fabricating vertical SBTTs in accordance with the present invention.
Figure 11B:
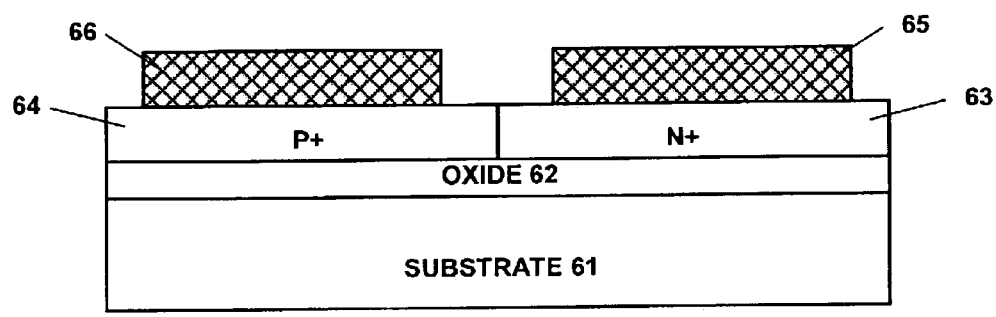
Figure 12:
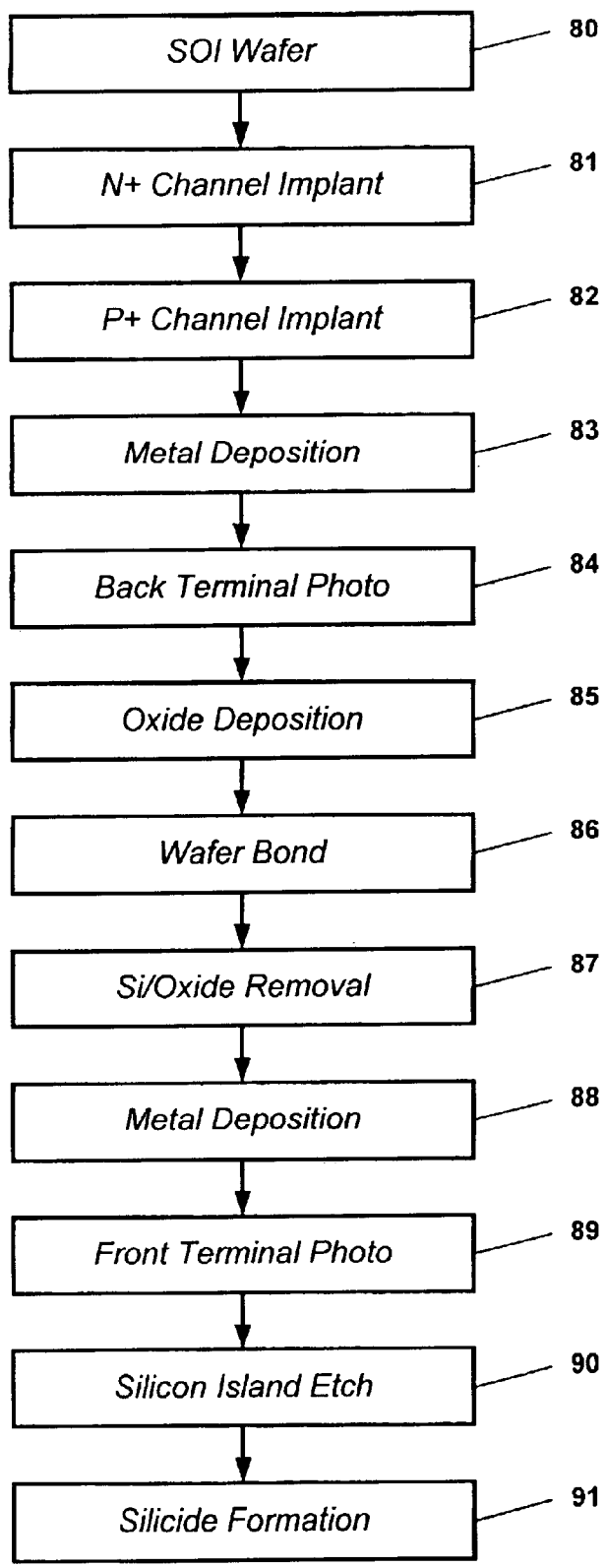
FIG. 12 shows the process steps of fabricating vertical SBTTs as shown in FIG. 11g.

FIG. 11b shows a layer of metal, with a thickness of about 1500 Å, is deposited (step 83) on the wafer by the method of sputtering or chemical vapor deposition (CVD). The metal is patterned by a photolithographic process (step 84) to form the back electrode 65 of an n-channel SBTT and the back electrode 66 of a p-channel SBTT, as shown in FIG. 11b.

Figure 11C:
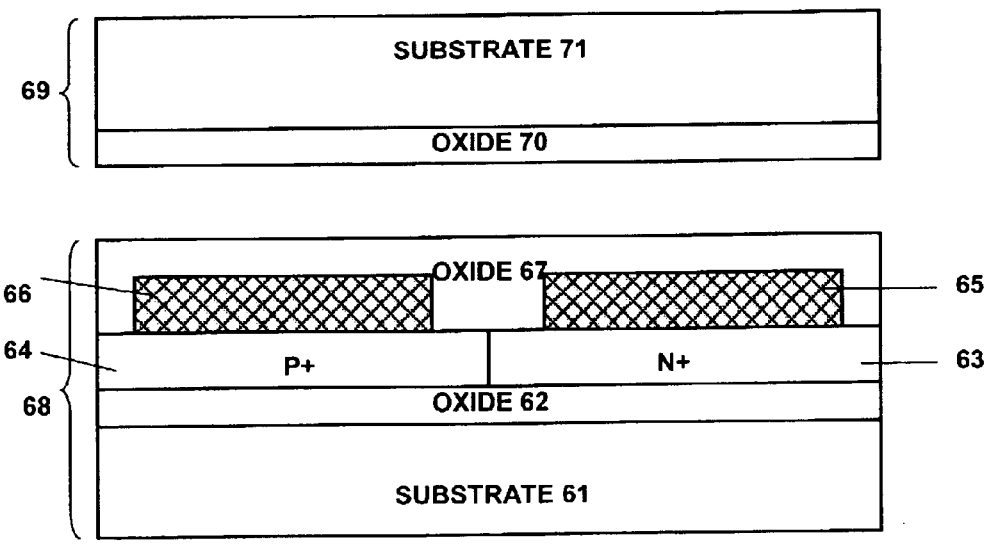

FIG. 11c shows a layer of silicon dioxide 67, with a thickness of about 2500 Å, is formed over the structure utilizing a conventional deposition technique (step 85) such as low pressure chemical vapor deposition (LPCVD). A handling wafer 69 is prepared for wafer bond (step 86). The handling wafer 69 includes a supporting silicon substrate 71 and a silicon dioxide layer 70, which is formed on the supporting substrate 71 by thermal oxidation. The handling wafer 69 is flipped over on top of the device wafer 68, as shown in FIG. 11e. The two wafers are bonded together through the contact of the two oxide layers 67 and 70. A heat treatment is carried out at a selected temperature to intensify the bonding force between the two oxide layers 67 and 70.

Figure 11D:
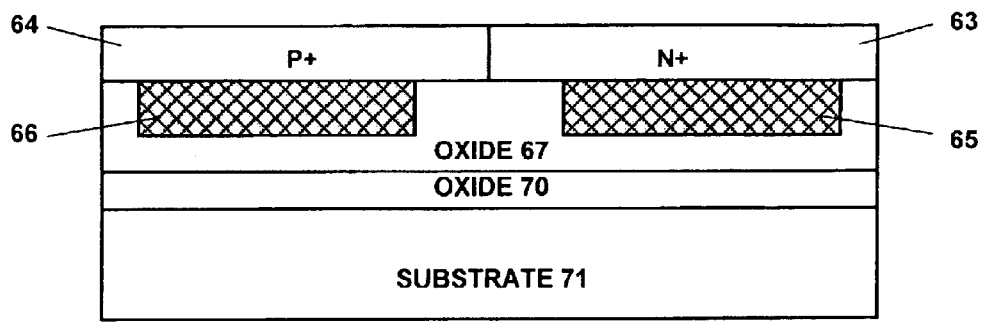
Figure 11E:
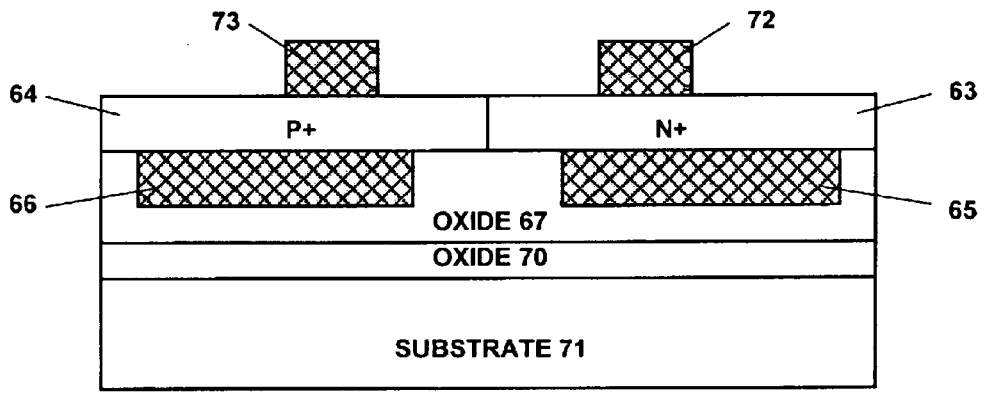

After the step of wafer bond, the bonded wafer is flipped over as shown in FIG. 11d. The silicon substrate 61 and the oxide layer 62 on the top are removed (step 87) by the etching processes such as wet chemical etch or chemical mechanical polishing (CMP).

A layer of metal, with a thickness of about 1500 Å, is deposited (step 88) on the wafer by the method of sputtering or chemical vapor deposition (CVD). The metal is patterned by a photolithographic process (step 89) to form the front electrode 72 of an n-channel SBTT and the front electrode 73 of a p-channel SBTT, as shown in FIG. 11e.

Figure 11F:
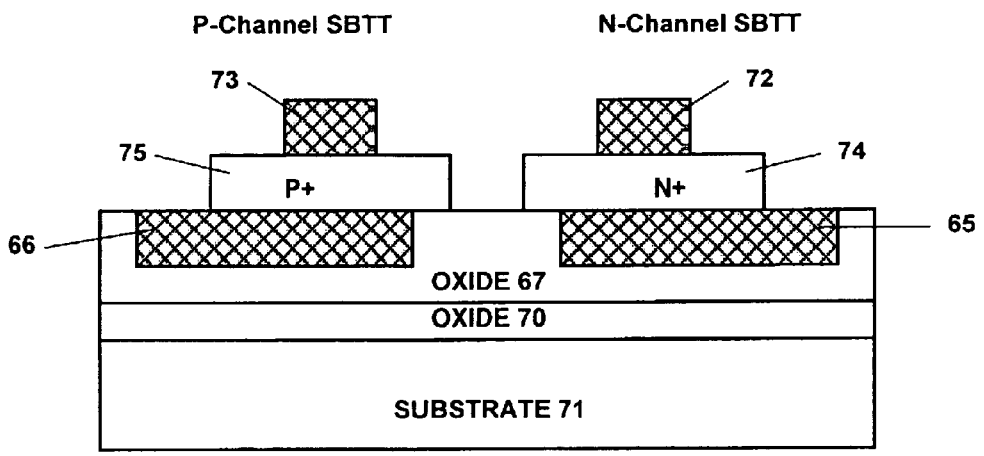

The silicon in the field area is removed by an etch process (step 90) for device isolation, as shown in FIG. 11f. The single crystal silicon island 74 is the base region of an n-channel SBTT and the single crystal silicon island 75 is the base region of a p-channel SBTT.

Figure 11G:
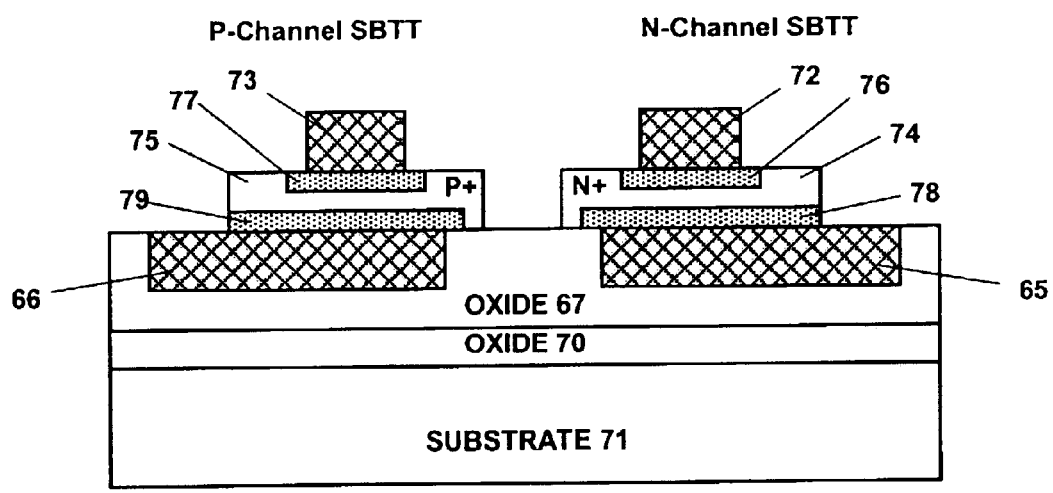

The wafer then goes through a silicidation process (step 91), in which the wafer is heated to a high temperature, such as 950° C., for about 60 seconds to form the metal silicide, as shown in FIG. 11g. The front silicide region 76 and the back silicide region 78 become the emitter and collector regions of an n-channel SBTT. The front silicide region 77 and the back silicide region 79 become the emitter and collector regions of a p-channel SBTT. The base width is the distance between the front silicide region 76 and the back silicide region 78 for the n-channel SBTT. The base width is the distance between the front silicide region 77 and the back silicide region 79 for the p-channel SBTT. In the silicidation process, metal reacts with silicon to form silicide. Because silicon is consumed in the silicidation process, the base width can be reduced to improve the current gain by increasing the base transport factor. The minimum thickness of the single-crystal silicon layer on the SOI wafer is about 150 Å from today's technologies. Silicidation process can make the base width smaller than the SOI's silicon layer thickness.

If the front electrode 72 (or 73) is the emitter electrode, the back electrode 65 (or 66) will be the collector electrode, or vice versa. The materials used in the front electrodes (72 and 73) and back electrodes (65 and 66) can be the same or different. Therefore, the front silicide regions (76 and 77) and the back silicide regions (78 and 79) can also be the same or different materials. Different materials can be used in the emitter/collector regions of n- and p-channel SBTTs to optimize the device performance individually.

The semiconductor base regions (74 and 75) are not completely covered by the front silicide regions (76 and 77) so that base contacts can be made on top of the semiconductor base regions (74 and 75). The back electrodes (65 and 66) are not completely covered by the semiconductor base regions (74 and 75) so that contacts to the back electrodes (65 and 66) from the interconnection lines are possible.

In one aspect of the present invention, FIG. 11g illustrates a three-dimensional three-terminal semiconductor device comprising a first electric terminal formed in a lower substrate layer and a middle substrate layer. The middle substrate layer includes a lower conductive region (the back silicide region 78 for n-channel SBTT or the back silicide region 79 for p-channel SBTT) in contact with the first electric terminal (the back electrode 65 for n-channel SBTT or the back electrode 66 for p-channel SBTT) in the lower substrate layer, and a middle semiconductor region (the n-type doped base region 74 for n-channel SBTT or the p-type doped base region 75 for p-channel SBTT) in contact with the lower conductive region (78 or 79) forming a first Schottky barrier junction at the interface of the middle semiconductor region (74 or 75) and the lower conductive region (78 or 79). The middle semiconductor region (74 or 75) is in contact with a second electric terminal (the base terminal). The middle substrate layer also includes an upper conductive region (the front suicide region 76 for n-channel SBTT or the front silicide region 77 for p-channel SBTT) in contact with the middle semiconductor region (74 or 75) forming a second Schottky barrier junction at the interface of the upper conductive region (76 or 77) and the middle semiconductor region (74 or 75). The upper conductive region (76 or 77) is separated from the lower conductive region (78 or 79) by the middle semiconductor region (74 or 75). The three-dimensional three-terminal semiconductor device further includes a third electric terminal (the front electrode 72 for n-channel SBTT or the front electrode 73 for p-channel SBTT) formed over the middle substrate layer. The third electric terminal (72 or 73) is in contact with the upper conductive region (76 or 77) in the middle substrate layer. The tunneling currents through the first Schottky barrier junction and the second Schottky barrier junction are substantially controlled by the voltage of the semiconductor base region (74 or 75).

The Schottky-barrier tunneling transistor (SBTT) described in the present invention has several important differences and advantages in comparison with the Schottky barrier (SB) MOSFET. SB-MOSFET differs from the common MOSFET in that the heavily doped source/drain regions, which are created by ion implantation or diffusion, in the common MOSFET are replaced by metal suicides. The SB-MOSFET, nevertheless, shares the same structure and limitations as the common MOSFET.

First, the SB-MOSFET requires a thin gate insulator with the same requirements as the gate insulator in a common MOSFET. The gate insulator needs to have a high dielectric constant, low gate leakage, and low interface state density. The control of the uniformity of such a thin layer is a key challenge in shrinking the MOS device dimensions. Currently there is no known solution to produce such a high-quality gate insulator using a high dielectric constant material. In contrast, such a gate insulator layer is absent in the SBTT device structure. A key obstacle to device scaling is therefore removed.

Secondly, the current conduction in the channel of a SB-MOSFET is still the same as the traditional MOSFET. A high gate voltage is required to induce an inversion layer, i.e. the channel, under the gate insulator. The power supply voltage is therefore difficult to be scaled down due to the requirement of carrier inversion. In contrast, the SBTT does not require carrier inversion in the base region. The injected carriers from the emitter region are the majority carriers in the base, because the base is n-type doped for an n-channel SBTT and p-type doped for a p-channel SBTT. The power supply voltage is easier to be scaled down.

Thirdly, the SB-MOSFET is a 4-terminal device, which requires a substrate contact. The transistor size is larger than the 3-terminal SBTT device. The number of SBTTs will be higher than the number of SB-MOSFETs to be packed on the same chip area.

Finally, the SB-MOSFET was reported to suffer from a large leakage current and a poor on/off drain current ratio due to thermionic emission. For the SBTT in the present invention, the thermionic emission current is negligible in the device turn-on mode. The tunneling current can be many orders of magnitude larger than the thermionic emission current. One of the major differences in the device structure between a SBTT and a SB-MOSFET is the base (or substrate) dopant type. For an n-channel SBTT, the base is n-type doped. A positive base voltage is used to turn on the device. The Schottky barrier junctions are reverse biased, and the thermionic emission currents are negligible. However, for an n-channel SB-MOSFET, the substrate is p-type doped. A positive gate voltage is used to turn on the device. The source and drain Schottky barrier junctions are slightly forward biased, and the thermionic emission currents contribute to the leakage current.

While the invention has been described with reference to specific embodiments, the description is illustrative of the invention and is not to be considered as limiting the invention. Various modifications and applications may occur for those skilled in the art without departing from the true spirit and scope of the invention as defined by the appended claims.

What is claimed is:

1. A three-terminal semiconductor transistor device, comprising:
    a) a base region formed by a semiconductor material, the base region being in contact with a first electric terminal;
    b) a conductive emitter region in contact with the semiconductor base region, forming a first Schottky barrier junction at the interface of the conductive emitter region and the semiconductor base region, the conductive emitter region being in contact with a second electric terminal; and
    c) a conductive collector region in contact with the semiconductor base region, forming a second Schottky barrier junction at the interface of the conductive collector region and the semiconductor base region, the conductive collector region being in contact with a third electric terminal,
wherein the tunneling current through the first Schottky barrier junction or the second Schottky barrier junction is substantially controlled by the voltage of the semiconductor base region.

2. The three-terminal semiconductor transistor device of claim 1 wherein the base region is not separated from the conductive emitter region or the conductive collector region by a continuous layer of insulating material.

3. The three-terminal semiconductor transistor device of claim 1 wherein the conductive emitter region or the collector region comprises one or more of metals, silicides, or metal compounds.

4. The three-terminal semiconductor transistor device of claim 1 wherein the conductive emitter region or the collector region comprises one or more of W, Ti, Ta, Mo, Pt, $TiSi_2$, $CoSi_2$, $NiSi_2$, $WSi_2$, $TaSi_2$, $MoSi_2$, PtSi, or TiN.

5. The three-terminal semiconductor transistor device of claim 1 wherein the base region comprises a semiconductor selected from the group of silicon, germanium, and compound semiconductors.

6. The three-terminal semiconductor transistor device of claim 5 wherein the base region is doped at a doping density in the range of $10^{17} - 3 \times 10^{21}$ cm$^{-3}$.

7. The three-terminal semiconductor transistor device of claim 1 wherein the base region is n-type doped, forming an n-channel Schottky-barrier tunneling transistor.

8. The three-terminal semiconductor transistor device of claim 7 wherein the n-channel Schottky-barrier tunneling transistor is turned on by applying a positive voltage to the base region.

9. The three-terminal semiconductor transistor device of claim 7 wherein the barrier height for electrons at the first Schottky barrier junction of the n-channel Schottky-barrier tunneling transistor is between 0.02 eV and 1.12 eV.

10. The three-terminal semiconductor transistor device of claim 1 wherein the base region is p-type doped, forming a p-channel Schottky-barrier tunneling transistor.

11. The three-terminal semiconductor transistor device of claim 10 wherein the p-channel Schottky-barrier tunneling transistor is turned on by applying a negative voltage to the base region.

12. The three-terminal semiconductor transistor device of claim 10 wherein the barrier height for holes at the first Schottky barrier junction of a p-channel Schottky-barrier tunneling transistor is between 0.02 eV and 1.12 eV.

13. The three-terminal semiconductor transistor device of claim 1 wherein the conductive emitter region and the conductive collector region comprise the same material.

14. The three-terminal semiconductor transistor device of claim 1 wherein the Fermi level of the conductive emitter region or the conductive collector region is between the conduction band edge and the valence band edge of the semiconductor base region at thermal equilibrium.

15. The three-terminal semiconductor transistor device of claim 1 wherein the Fermi level of the conductive emitter region or the conductive collector region is below the mid band gap of the semiconductor base region at thermal equilibrium.

16. The three-terminal semiconductor transistor device of claim 1 wherein the conductive emitter region or the conductive collector region comprise one or more of $WSi_2$, $CoSi_2$, $NiSi_2$, $TiSi_2$, $TaSi_2$, $CrSi_2$, $MoSi_2$, and $RhSi_2$.

17. A three-dimensional three-terminal semiconductor device, comprising:
    a) a first insulating substrate layer; and
    b) a second substrate layer formed above the first insulating substrate layer, comprising
        i) a base region formed by a semiconductor material, the base region being in contact with a first electric terminal;
        ii) a conductive emitter region in contact with the semiconductor base region, forming a first Schottky barrier junction at the interface of the conductive emitter region and the semiconductor base region, the conductive emitter region being in contact with a second electric terminal; and
        iii) a conductive collector region in contact with the semiconductor base region, forming a second Schottky barrier junction at the interface of the conductive collector region and the semiconductor base region, the conductive collector region being in contact with a third electric terminal,
wherein the tunneling current through the first Schottky barrier junction or the second Schottky barrier junction is substantially controlled by the voltage of the semiconductor base region.

18. The three-dimensional three-terminal semiconductor device of claim 17, further comprising a substrate below the first insulating layer.

19. The three-dimensional three-terminal semiconductor device of claim 17, wherein the width of the base region is controlled by the encroachment of the silicidation process.

20. The three-dimensional three-terminal semiconductor device of claim 17, wherein the width 5of the base region is less than 1000 Å.

21. The three-dimensional three-terminal semiconductor device of claim 17, wherein the base region is formed in the single crystal silicon layer of a silicon-on-insulator (SOI) wafer.

22. A three-dimensional three-terminal semiconductor device, comprising:
   a) a first electric terminal formed in a lower substrate layer;
   b) a middle substrate layer, comprising
      i) a lower conductive region in contact with the first electric terminal in the lower substrate layer,
      ii) a middle semiconductor region in contact with the lower conductive region in the lower substrate layer forming a first Schottky barrier junction at the interface of the middle semiconductor region and the lower conductive region, such middle semiconductor region being in contact with a second electric terminal; and
      iii) an upper conductive region in contact with the middle semiconductor region forming a second Schottky barrier junction at the interface of the upper conductive region and the middle semiconductor region, such upper conductive region being separated from the lower conductive region by the middle semiconductor region; and
   c) a third electric terminal formed over the middle substrate layer, the third electric terminal being in contact with the upper conductive region in the middle substrate layer, wherein the tunneling current through the first Schottky barrier junction or the second Schottky barrier junction is substantially controlled by the voltage of the middle semiconductor region.

23. The three-dimensional three-terminal semiconductor device of claim 22 wherein the lower conductive region in the middle substrate layer is a conductive emitter region or a conductive collector region.

24. The three-dimensional three-terminal semiconductor device of claim 22 wherein the upper conductive region in the middle substrate layer is a conductive emitter region or a conductive collector region.

25. The three-dimensional three-terminal semiconductor device of claim 22 wherein the middle semiconductor region in the middle substrate layer is a semiconductor base region.

26. The three-dimensional three-terminal semiconductor device of claim 22 wherein the semiconductor base region is formed in the single crystal silicon layer of a silicon-on-insulator (SOI) wafer.

27. The three-dimensional three-terminal semiconductor device of claim 22 wherein the middle semiconductor region in the middle substrate layer is not fully covered by the upper conductive region in the middle substrate layer.

28. The three-dimensional three-terminal semiconductor device of claim 27 wherein the second electric terminal is formed above the area of the middle semiconductor region that is not covered by the upper conductive region in the middle substrate layer.

29. The three-dimensional three-semiconductor device of claim 22 wherein the first electric terminal in the lower substrate layer is not fully covered by the lower conductive region in the middle layer.

30. The three-dimensional three-terminal semiconductor device of claim 22, wherein the thickness of the middle semiconductor region in the middle substrate layer is less than 1000 Å.

31. The three-dimensional three-terminal semiconductor device of claim 22, wherein the thickness of the middle semiconductor region is controlled by the encroachment of the silicidation process.

* * * * *

UNITED STATES PATENT AND TRADEMARK OFFICE
CERTIFICATE OF CORRECTION

PATENT NO.    : 6,744,111 B1
DATED         : June 1, 2004
INVENTOR(S)   : Wu, Koucheng It is certified that error appears in the above-identified patent and that said Letters Patent is hereby corrected as shown below:

Column 13,
Line 66, should be read as -- ... oxide thickness less than 10 Å --.

Column 18,
Line 33, "metal suicides" should be changed to -- metal silicides --.

Signed and Sealed this

Eighteenth Day of January, 2005

JON W. DUDAS
*Director of the United States Patent and Trademark Office*